(12) United States Patent
Schrems et al.

(10) Patent No.: US 6,465,370 B1
(45) Date of Patent: Oct. 15, 2002

(54) LOW LEAKAGE, LOW CAPACITANCE ISOLATION MATERIAL

(75) Inventors: Martin Schrems, Langebrueck (DE); Rolf-Peter Vollertsen, Essex Junction, VT (US); Joachim Hoepfner, Planegg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/105,633

(22) Filed: Jun. 26, 1998

(51) Int. Cl.⁷ .............................................. H01L 21/469
(52) U.S. Cl. ..................... 438/783; 438/514; 438/528; 438/787; 438/918
(58) Field of Search ................................ 438/514, 918, 438/974, 516, 528, 787, 783

(56) References Cited

U.S. PATENT DOCUMENTS

| | | | |
|---|---|---|---|
| 3,736,192 A | * 5/1973 | Tokuyama et al. | 438/403 |
| 3,925,106 A | * 12/1975 | Ku et al. | 438/383 |
| 5,352,636 A | * 10/1994 | Beinglass | 438/475 |
| 5,492,854 A | * 2/1996 | Ando | 438/396 |
| 5,506,178 A | * 4/1996 | Suzuki et al. | 438/773 |
| 5,966,624 A | 10/1999 | Shen | |

FOREIGN PATENT DOCUMENTS

| | | |
|---|---|---|
| JP | 55027906 | 10/1981 |
| JP | 60219367 | 4/1987 |
| JP | 63075201 | 10/1989 |
| JP | 06122304 | 12/1995 |

OTHER PUBLICATIONS

Bruel ("Smart Cut": A Promising New SOI Material Technology, 178 Proceedings 1995 IEEE International SOI Conference, Oct. 1995).*
Wolf (Silicon Processing in the VLSI ERA, vol. 1, Copyright 1986 by Lattice Press; pp. 222–223 and 242).*
J.M.Green et al.; "Silicon Wafers With High–Dielectric Integrity"; IBM Technical Disclosure Bulletin; vol. 16, No. 6; Nov. 1973.
L. Nesbit et al.; A $0.6 \mu m^2$ 256Mb Trench DRAM Cell With Self–Aligned BuriEd Strap (BEST); 1993; IEEE; pp. 2–5.
EP 0 967 646 A2 (corrected Publication).
EP 0 967 646 A3 (corrected Publication).

* cited by examiner

*Primary Examiner*—Eddie Lee
*Assistant Examiner*—N. Drew Richards
(74) *Attorney, Agent, or Firm*—Stanton Braden

(57) ABSTRACT

A method for reducing a capacitance formed on a silicon substrate includes the step of introducing hydrogen atoms into a portion of said surface to increase the dielectric constant of such portion of the surface increasing the effective thickness of the dielectric material and hence reducing said capacitance. The method includes the step of forming the silicon dioxide layer with a thickness greater than two nanometers. The step of introducing hydrogen includes forming hydrogen atoms in the surface with concentrations of $10^{17}$ atoms per cubic centimeter, or greater. In one embodiment the hydrogen atoms are introduced by baking in hydrogen at a temperature of 950° C. to 1100° C. and pressure greater than 100 Torr. A trench capacitor DRAM cell is provided wherein the hydrogen provides a passivation layer to increase the effective capacitance around a collar region and thereby reduce unwanted transistor action.

16 Claims, 15 Drawing Sheets

LOW LEAKAGE, LOW CAPACITANCE ISOLATION MATERIAL

BACKGROUND OF THE INVENTION

This invention relates to semiconductors and more particularly to material used in semiconductors to provide low capacitance dielectric isolation.

As is known in the art, semiconductors devices have a wide range of applications. Many of these applications require the use of a dielectric to provide isolation between active devices, between conductive plates of a capacitors of the type used in dynamic random access memories (DRAMs), and between layers of conductive material, for example. Typical isolation materials are silicon dioxide and silicon nitride. Silicon dioxide is typically used to electrically isolate devices, for example. In order to obtain a relatively high capacitance with a relatively thin layer of dielectric material, silicon nitrite is typically used because it has a higher dielectric constant that silicon dioxide. For example, in a trench capacitor used in some DRAMs, a trench is formed in a silicon substrate, the walls of the trench are then exposed to hydrogen to pre-clean or smooth the walls of the trench and to thereby obtain a uniformly deposited (e.g. thermal and LPCVD deposited) silicon nitride layer over the pre-cleaned trench walls. The hydrogen pre-clean is typically performed at a temperature of 700° C. to 950° C. and a pressure of 100 Torr for a single wafer Rapid Thermal Chemical Vapor Deposition (RTCVT) or 1–20 Torr for batch furnaces. It is noted that one or two mono-layers of native silicon dioxide (i.e., silicon dioxide layers below one nanometer thickness formed because of clean room oxygen which are typically present) may be formed over the silicon walls of the trench prior to the deposition of the silicon nitride layer. During the hydrogen pre-cleaning step, the thickness of any native silicon dioxide may be reduced thereby enabling the formation of a more nitrogen rich layer to thereby increase the capacitance of the trench capacitor. As noted above, silicon dioxide is used as an isolation material having thickness of at least 2–5 nanometers for gate oxides; however, the use of a hydrogen pre-clean is not used because this would degrade implanted device regions by interaction of hydrogen with dopants such as arsenic, phosphorous and boron.

SUMMARY OF THE INVENTION

In accordance with one feature of the invention, a method is Provided for reducing the capacitance of a capacitor formed on a silicon substrate. The capacitor has, as a dielectric thereof, a silicon dioxide layer on a surface of the silicon substrate. The method includes the step introducing hydrogen atoms into a portion of said surface to decrease the dielectric constant of such portion of the surface increasing the effective thickness of the dielectric and hence reducing the capacitance of said capacitor.

In accordance with another feature of the invention, the method including the step of forming the silicon dioxide layer with a thickness greater than two nanometers.

In accordance with another feature of the invention, the step of introducing hydrogen comprises baking in hydrogen at a temperature of 950° C. to 1100° C. and pressure greater than 100 Torr.

In accordance with another feature of the invention, the step of introducing hydrogen comprises the step of forming hydrogen atoms in the surface with concentrations of $10^{17}$ atoms per cubic centimeter, or greater.

In accordance with still another feature of the invention, a DRAM cell is provided having a transistor coupled to a capacitor. The cell includes a silicon substrate having the transistor and the capacitor disposed in the substrate. The transistor has source and drain regions having a first type conductivity disposed in an upper portion of the substrate. The source and drain regions are disposed in a well in the substrate. The well has a conductivity type opposite to the first type conductivity. The capacitor is a trench capacitor and includes a first dielectric layer disposed on intermediate and lower walls of the trench. A first conductive material is disposed in the trench on the first dielectric layer and an upper portion of such first conductive material. The first conductive material is electrically connected to one of the source and drain regions through a node region disposed in the substrate between such one of the source and drain regions and the upper portion of the first conductive material in the trench. The first conductive material provides a first electrode for the capacitor. A second conductive material is disposed in the substrate about the lower portion of the trench. The second conductive material has the first type conductivity and is dielectrically separated from the first conductive material by the lower portion of the first dielectric material to provide a second electrode for the capacitor. A second dielectric material is disposed the substrate about the intermediate portion of the first dielectric region to dielectrically isolate the node region of the trench from the second conductive material. A hydrogen passivation layer is disposed in the intermediate portion of the substrate about portions of the second dielectric material.

BRIEF DESCRIPTION OF THE DRAWING

Other features of the invention, as well as the invention itself, will become more readily apparent from the following detailed description when read together with the accompanying drawings, in which.

DESCRIPTION OF THE PREFERRED EMBODIMENTS

Figure 1A:
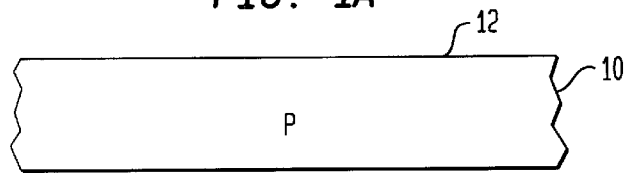
FIGS. 1A–1E are diagrammatical, cross-sectional sketches of a capacitor formed in accordance with the present invention at various steps in the manufacture of such capacitor.
Figure 1B:
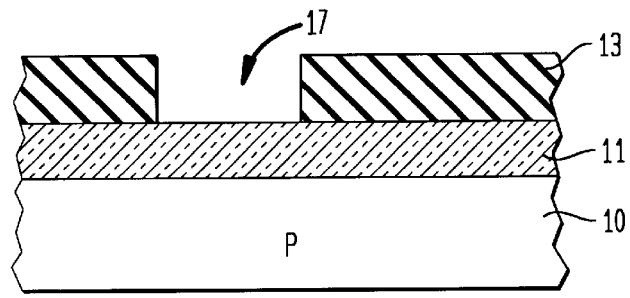
Figure 1C:
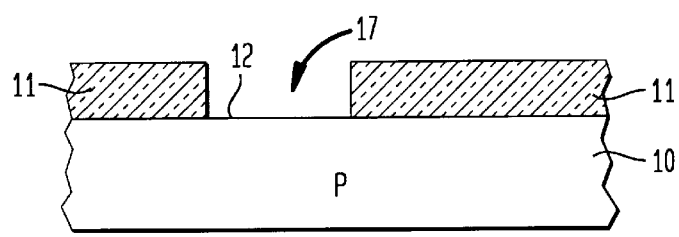
Figure 1D:
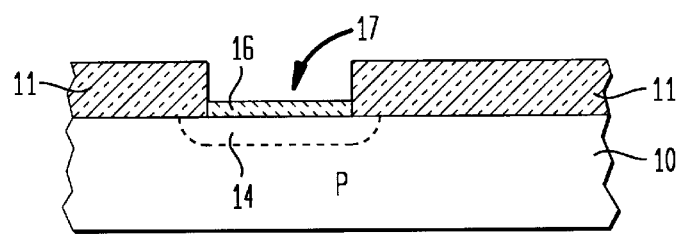

Referring now to FIGS. 1A–1E, a semiconductor body 10 is shown. Here, in this example, the semiconductor body 10 is silicon having boron dopant (i.e., p type conductivity) with a doping concentration of $10^{16}/cm^3$. A layer 11 of silicon dioxide is formed by thermal oxidation to a thickness of about 200 A over the upper surface 12 (FIG. 1A) of the semiconductor body 10, as shown in FIG. 1B. A layer 13 of photoresist, with an underlying antireflection coating, not shown, is deposited over the silicon dioxide layer 13, and patterned using convention photolithography to have a circular aperture 17 formed therein, as shown in FIG. 1B The structure is then exposed to a reactive ion etch (RIE) to remove the portion of the silicon dioxide layer 11 exposed by the aperture 17. The photoresist layer 13 and antireflection coating are striped. A sacrificial silicon dioxide layer, not shown is thermally grown over the exposed portion of the surface 12 of the semiconductor body. The sacrificial thermally grown silicon dioxide, not shown, is then removed to remove any damage to the surface from the RIE. More particularly, the upper surface 12 (FIG. 1C) of the silicon body 10 is then pre-cleaned with dilute hydrofluoric acid, here 200 parts water to one part hydrofluoric acid for 60 seconds to remove any native silicon dioxide from such surface 12.

Next, a silicon dioxide dielectric layer 16 (FIG. 1D) is thermally grown over the surface of the silicon body 10 using rapid thermal oxidation (RTO). More particularly, the silicon dioxide layer 16 is grown at 1050° C. for 48 seconds using a flow rate of 5 standard liters per minute of oxygen. The process yield about a 6.1 nanometer thickness of silicon dioxide dielectric layer 16 over the surface 12 of the silicon body 10.

The body 10 is then placed in a hydrogen containing furnace and baked in the hydrogen containing furnace at a temperature of 950° C. for one minute, at a pressure of 100 Torr and a flow rate for the hydrogen gas of 10 standard liters per minute. The conditions may be in the range of temperatures from 800° C. to 1200° C., for a time in the range of from 15 seconds to 5 hours, e.g., a process at 950° C. or 1050° C. per one minute in hydrogen.

Figure 1E:
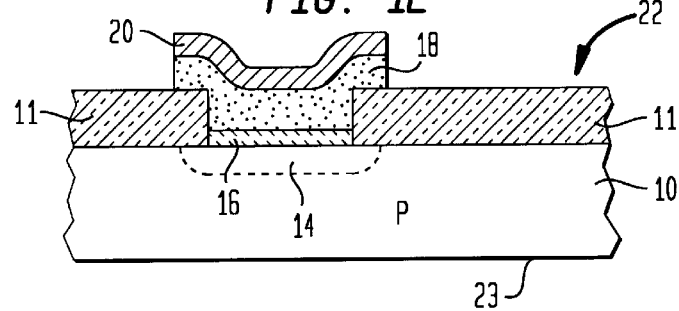

It is also noted that the hydrogen incorporation can precede the dielectric formation. In such case, the silicon surface cleaning step includes use of a cleaner such as dilute hydrofluoric acid, hydrofluoric acid vapor, or $HF/NH_3$ vapor to remove or thin down any pre-existing native silicon dioxide, as for example any remaining sacrificial silicon dioxide noted above. Whether the hydrogen passivation region 14 is formed prior to the formation of the silicon dioxide layer 16 or after the formation of the silicon dioxide layer, the process forms a hydrogen passivation region, or layer 14 (FIG. 1D) in the upper surface portion of the silicon body 10. Next, a layer 18 of doped polycrystalline silicon (FIG. 1E) is chemically vapor deposited over the silicon dioxide layers 11 and 16. Here, the doped polycrystalline silicon layer 18 has a thickness of, for example, 50 nm and a doping concentration for example for phosphorous of $10^{19}/cm^3$ to $10^{20}/cm^3$. Next, a metal contact layer 20, here aluminum or tungsten silicide, is evaporated or deposited over the doped polycrystalline silicon layer 18. Next, the layers 18 and 20 are patterned using conventional photolithography to provide the structure shown in FIG. 1E. Here, the shape of the dielectric layer 16 is circular having a surface area of 0.001 $cm^2$. It is noted that the metal layer 20 and the doped polycrystalline silicon layer 18 are also patterned into a circular shape using conventional photolithography to thereby form a capacitor 22 with a circular shaped dielectric provided by the silicon dioxide layer 16 and a circular shaped upper conductor plate, or electrode provided by the doped polycrystalline layer 18 and the metal 20. The other, i.e., lower, plate of the capacitor 22 is provided by the doped silicon substrate, or body 10. Thus, one electrode for the capacitor 22 is provided by the doped polycrystalline silicon layer 18 and the metal layer 20, and the second electrode is the back surface 23 of the p doped substrate 10, as indicated in FIG. 1E.

Figure 2:
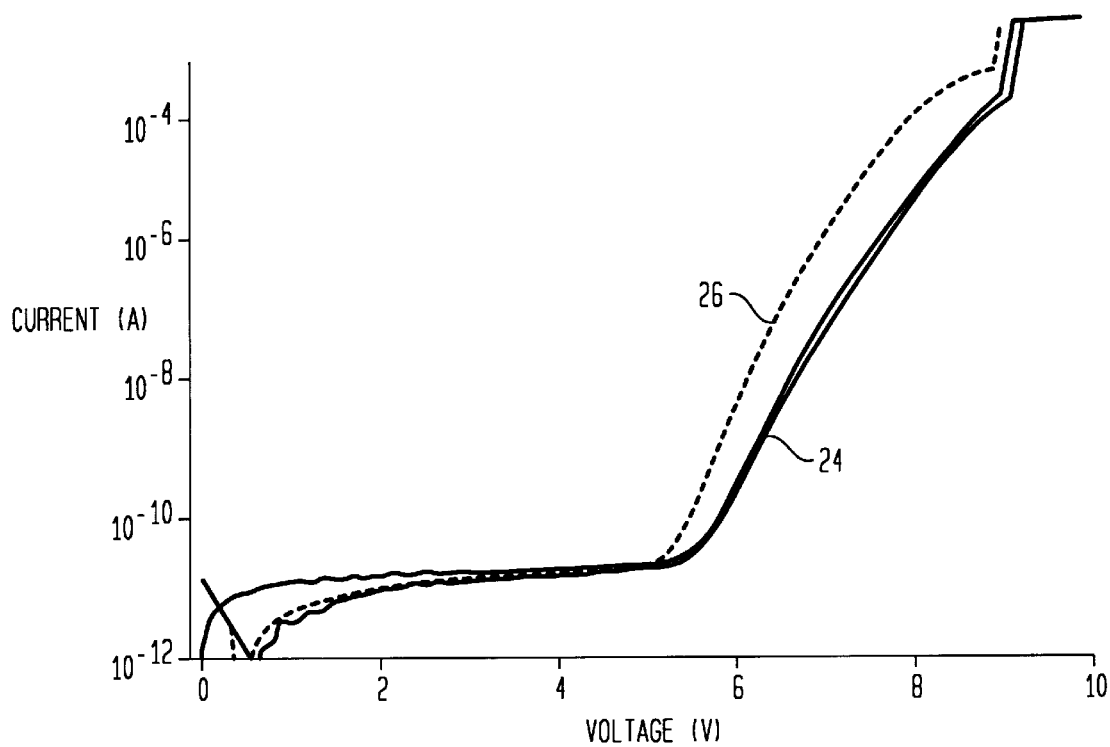
FIG. 2 is a graph comparing the leakage current of a capacitor made in accordance with the process shown in FIGS. 1A–1E and a capacitor made according to the PRIOR ART.

Referring to FIG. 2, the leakage current through the capacitor 22 (FIG. 1E) (i.e., from the upper electrode to the substrate or body 10) as a function of the voltage between the upper plate provided by the doped polycrystalline layer 18 and metal layer 20 and the substrate 10 is shown for the capacitor 22 shown and described above in connection with FIGS. 1A–1E by the solid curve 24 in FIG. 2. Also shown by the dotted curve 26 in FIG. 2 is the leakage current through a capacitor (i.e., from the upper electrode to the substrate) as a function of the voltage between the upper plate and the substrate with such capacitor having the same physical dimensions (i.e., lower plate conductivity, thermally grown silicon dioxide dielectric layer thickness and surface area, and same doped polycrystalline silicon-aluminum upper plate conductivity, shape and surface area) as the capacitor 22 shown and described above in connection with FIG. 1E but without using the hydrogen bake, i.e., without the hydrogen passivation layer 14. It is noted that with the hydrogen passivation, for the same thickness silicon dioxide dielectric layers, the leakage current has decreased by at least an order of magnitude (i.e., a factor of at least 10) because of the hydrogen passivation layer for stress voltages across the capacitor (i.e., dielectric breakdown voltages) of 5 volts, or greater.

Figure 3:
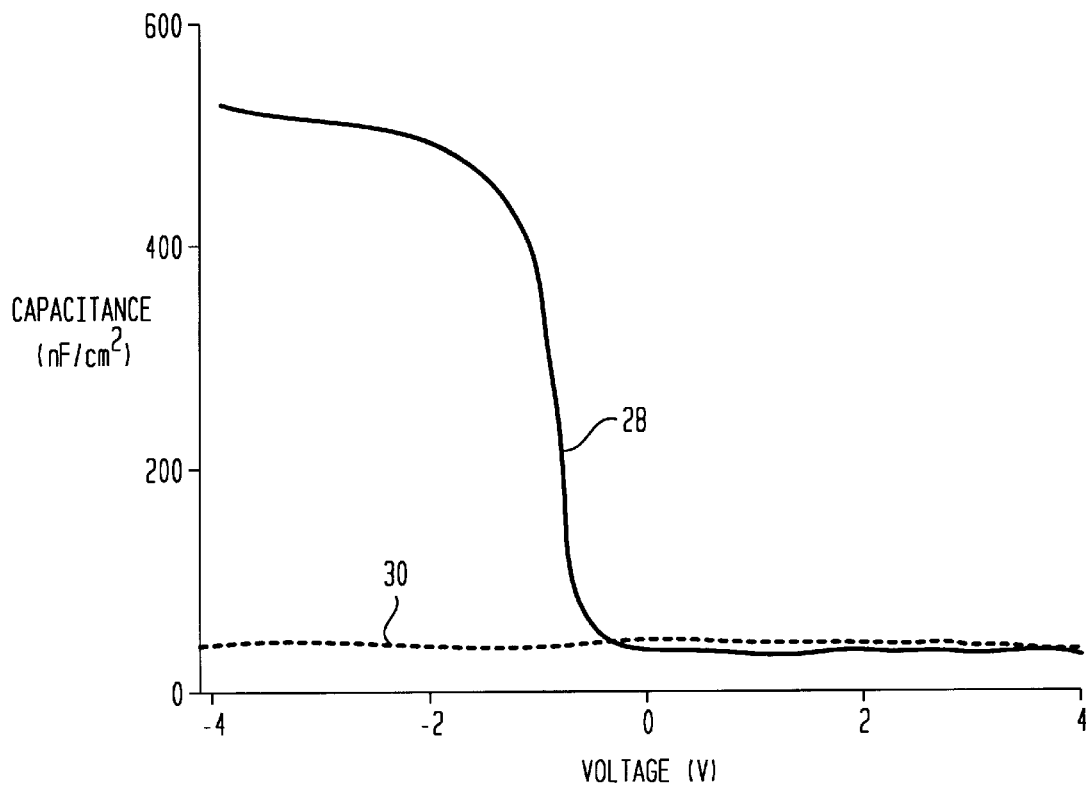
FIG. 3 is a graph comparing the capacitance of a capacitor made in accordance with the process shown in FIGS. 1A–1E and a capacitor made according to the PRIOR ART.

Referring to FIG. 3, the capacitance as a function of the voltage between the upper plate provided by the doped polycrystalline 18 and metal layer 20 and the substrate 10 is shown for the capacitor 22 shown and described above in connection with FIG. 1E by the solid curve 28 in FIG. 3. Also shown by the dotted line 30 in FIG. 3 is the capacitance as a function of the voltage between the upper plate 18 and the substrate 10 with such capacitor having the same physical dimensions (i.e., lower plate conductivity, thermally grown silicon dioxide dielectric layer thickness and surface area, and same doped polycrystalline silicon-aluminum upper plate conductivity, shape and surface area). It is noted that the maximum capacitance is only about 30–50 nanoFarads/cm$^{-2}$ for the capacitor having the hydrogen passivation layer 14 (FIG. 1E) compared to a capacitance of greater than 500 nanoFarads/cm$^{-2}$ for the capacitance without the hydrogen passivation layer 14. Thus, it is noted that with the hydrogen passivation, for the same thickness of the silicon dioxide dielectric layers, the capacitance is lower by at least a factor of 10.

From the above, it is noted that the effect of the hydrogen passivation layer 14 is to enable the use of physically thinner dielectric layers (i.e., thinner by an order of magnitude) and still achieve the same degree of leakage current and with the same degree of low capacitance. Consequently, achieving the same dielectric properties with thinner dielectric enables devices to have less physical stress develop in the silicon body 10 where silicon dioxide isolation regions are formed.

The formula for capacitance C for storing electrical charge of the capacitor is $C = \in A/d$, where $\in$ is the dielectric constant of the capacitor dielectric material disposed between the plates of the capacitor, A is the surface area of the plates and d is the thickness of the dielectric material, i.e., layer 16 (FIG. 1E). For a dielectric material of silicon dioxide (SiO$_2$) $\in = 3.9 \in_o$ where $\in_o$ is the dielectric constant of a vacuum. The comparison shown and described in connection with FIGS. 2 and 3 were made with different plate areas, A, and the capacitance varied in accordance with the area A in the manner set forth by the formula set forth above. From the above, it has been concluded that the portion of the near surface region exposed (i.e., the surface 12) to the hydrogen must have been passivated by the hydrogen to act as an additional dielectric material thereby increasing the effective thickness of the capacitance dielectric and thereby deceasing such capacitance. To put it another way, the total capacitance in the case of the hydrogen pre-treated sample is thus a series of the silicon dioxide dielectric layer 16 and the passivation layer 14 (FIG. 1E)) provided by the hydrogen. The capacitance of the capacitor 22 having the hydrogen passivation layer 14 may therefore be represented as: $C_{Hydrogen} = \{(d_{SiO2}/\in_{SiO2}) + (d_{PL}/\in_{PL})\}^{-1} A$, where $d_{SiO2}$ is the thickness of the silicon dioxide layer 16, $\in_{SiO2}$ is the dielectric constant of silicon dioxide layer 16, $d_{PL}$ is the thickness of the hydrogen passivation layer 14, and $\in_{PL}$ is the dielectric constant of the hydrogen passivation layer 14. The lowering of the leakage current (FIG. 2) may thus be understood qualitatively as being due to the increase of the total effective thickness, $d_{eff}$, of the dielectric material, of the capacitor 22, where $d_{eff} = \{(d_{SiO2}/\in_{SiO2}) + (d_{PL}/\in_{PL})\} \in_{SiO2}$. Therefore, $C_{Hydrogen} = \in_{SiO2} A/d_{eff}$ whereas the non-hydrogen passivated capacitor capacitance is $C = \in_{SiO2} A/d_{SiO2}$ where $d_{SiO2}$ in the example above is about 6 nm. From FIG. 3 we know that $C_{Hydrogen}/C$ is about $10^{-1}$. Therefore, $d_{PL} = (C/C_{Hydrogen}) - 1)d_{SiO2} \in_{PL}/\in_{SiO2} = (10-1)(6 \text{ nm}/3.4)\in_{PL}/\in_o$, where $\in_o$ is the dielectric constant of a vacuum, for a 6 nm thick oxide with a hydrogen pre-bake. Thus, if $\in_{PL} = \in_o$ (i.e., the theoretic minimum possible value of $\in_{PL}$) then $d_{PL} = 14$ nm. If $\in_{PL} = 10\in_o$, then $d_{PL} = 140$ nm. Thus, typically $\in_{PL}$ will be between 4 nm and several tens, or a 100, nanometers. By reducing the hydrogen baking temperature, time and pressure (or partial pressure, (e.g., dilution with argon) the thickness of $d_{PL}$ can be reduced accordingly.

Figure 4:
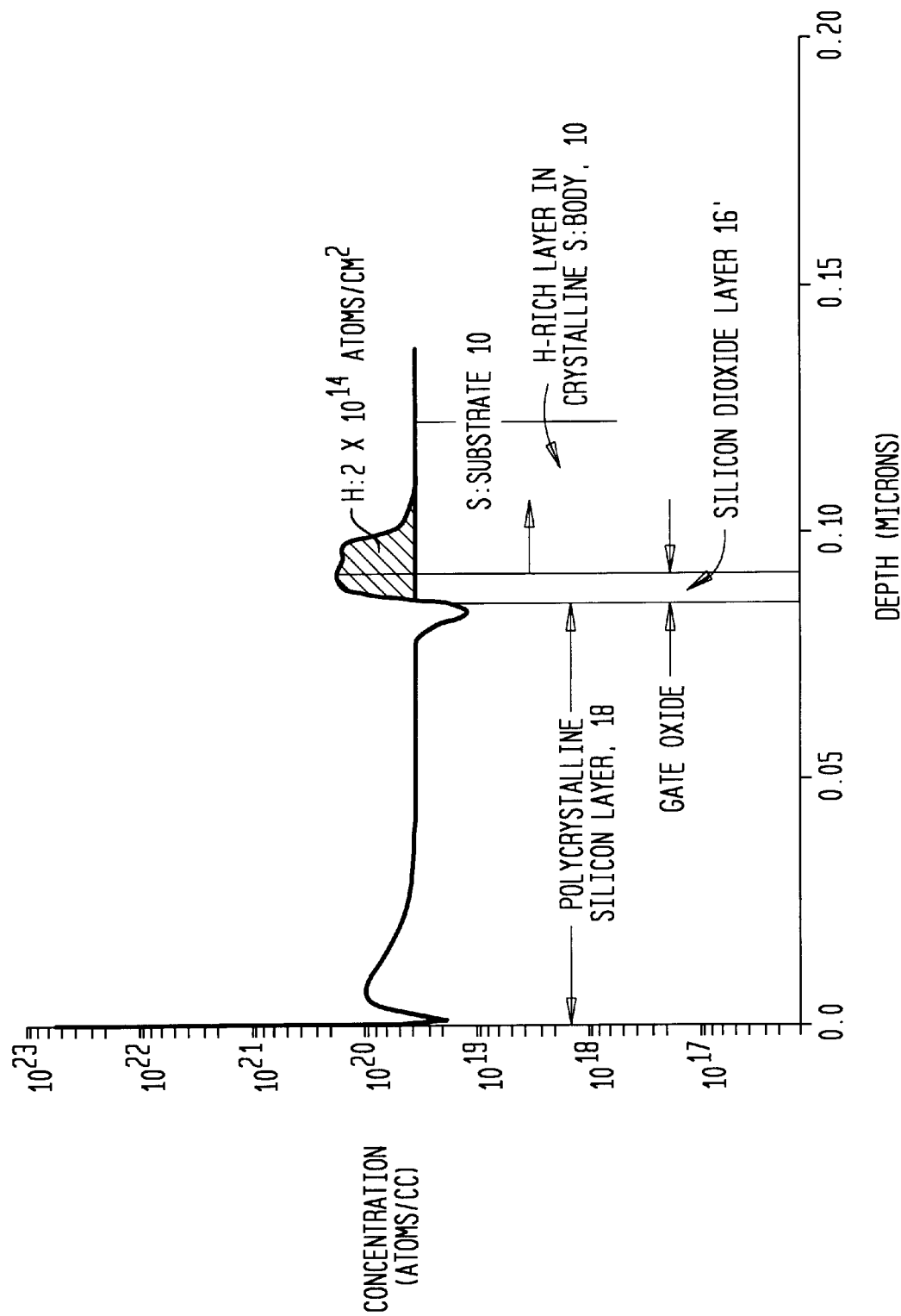
FIG. 4 is a Secondary Ion Mass Spectroscopy (SIMS) plot of hydrogen concentration as a function of depth into a capacitor made in accordance with the process of FIGS. 1A–1E.

FIG. 4 show SIMS profiles (i.e., hydrogen concentration as a function of depth, where depth 0 is the top of the polycrystalline silicon layer 18 (FIG. 1D), the silicon dioxide layer 16 starts at a depth of 0.05 microns and has a thickness of about 6.1 nm) for the hydrogen pre-bake sample (H$_2$+RTO) after a phosphorous doped polycrystalline silicon gate is deposited and after a Rapid Thermal Process (RTP) annealing step at 900° C. to 1000° C. (which may be performed to activate the dopants). It can be seen that hydrogen concentrations greater than $10^{20}$ cm$^{-3}$ are present both in the near surface region of the crystalline silicon layer 18 and also at levels between 2–3 $10^{20}$ cm$^{-3}$ in the thermal SiO$_2$ layer 16. On the other hand there is no noticeable boron out-diffusion which supports the theory that boron and near surface defects in the silicon body 10 have been passivated by the hydrogen.

As noted above, the hydrogen anneal (i.e., pre-bake) was performed prior to the formation of the silicon dioxide dielectric layer 16, the hydrogen anneal may be performed after the formation of the silicon dioxide dielectric layer 16. Further, pure hydrogen need not be used but, rather, diluted hydrogen, such as a hydrogen/argon mixture may also be used. Both the hydrogen baking process and the silicon dioxide formation may be performed in a single wafer RTP, RTCVD or a batch furnace. Both dry oxygen and wet oxygen (H$_2$O) thermal oxides without or with several % HCl may be used. Alternatively, nitrided oxides e.g., in N$_2$O or NO containing ambient are also possible. The hydrogen treatment, prior or post, the dielectric formation can be performed in the same tool without exposure to clean room air, but the process can also be performed if separate steps are performed.

To put it another way, the method described above reduces the capacitance of a capacitor formed on a silicon substrate. The capacitor has, as a dielectric material thereof, a silicon dioxide layer on a surface of the silicon substrate. The method includes the step of introducing hydrogen atoms into a portion of said surface to decrease the dielectric constant of such portion of the surface increasing the effective thickness of the dielectric material and hence reducing the capacitance of such capacitor.

Figure 5A:
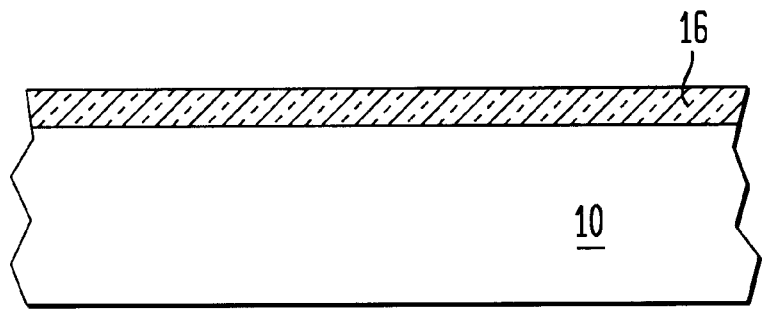
FIGS. 5A–5C are diagrammatical, cross-sectional sketches of a capacitor formed in accordance with another embodiment of the present invention at various steps in the manufacture of such capacitor.
Figure 5B:
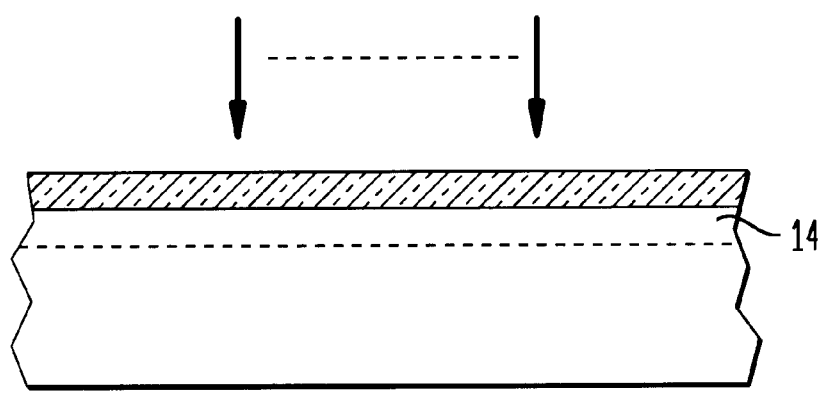
Figure 5C:
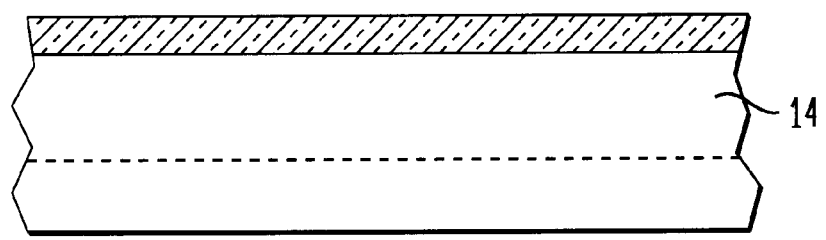

Referring now to FIGS. 5A–5C, an alternative embodiment is shown for forming the hydrogen passivation layer 14. Here, the silicon substrate 10 (FIG. 5A) is implanted with hydrogen ions which provides additional controllability of the hydrogen depth profile and size of the passivation layer, $d_{PL}$. As an example, Plasma Doping (PLAD) or Plasma Immersion Ion Implantation (PIII) can be performed e.g. through a 2–5 nm thick silicon dioxide layer 16 at an energy of 0.5–0.7 keV and a dose of $3 \times 10^{13}$ cm$^{-2}$, which yields a junction depth of 15–50 nm depending on the pressure. Typically, a triangular distribution of hydrogen atoms is formed by PIII or PLAD. Typically, a range of doses from $1 \times 10^{13}$ cm$^{-2}$ or greater by several order of magnitudes such as, for example $10^{17}$ cm$^{-2}$, can be achieved. In another example, a beam line ion implanter may be used which yields a Gaussian-type distribution (e.g., 10 keV, $3 \times 10^{14}$ cm$^{-2}$) and a junction depth of about 0.16 μm. In this embodiment, the silicon dioxide layer 16 acts as a screen layer during the hydrogen implantation and is stripped e.g., by a wet etch in buffered hydrofluoric acid, and then, after the hydrogen implantation, another dielectric layer of silicon dioxide is formed. The concentration of hydrogen atoms in the passivation layer is in the order of $10^{17}$ atoms per cubic centimeter, or higher.

Alternatively, hydrogen is implanted through the silicon dioxide layer which is not stripped but may be annealed after the hydrogen implantation to heal any implantation damage to the silicon substrate 10. Anneal temperatures may range from 650° C. to 950° C. and times from 1 minute to 1 hour, although other annealing conditions are also possible to produce the structure shown in FIG. 5C.

Since, as noted above, the hydrogen passivation effect has not been observed for nitrides, the use of thermal silicon dioxide or chemically vapor deposited (CVD) or plasma enhanced chemically vapor deposited (PECVD) silicon dioxide or oxynitride is preferred as the dielectric material, although the use of other dielectric materials may be used is also possible.

Figure 6A:
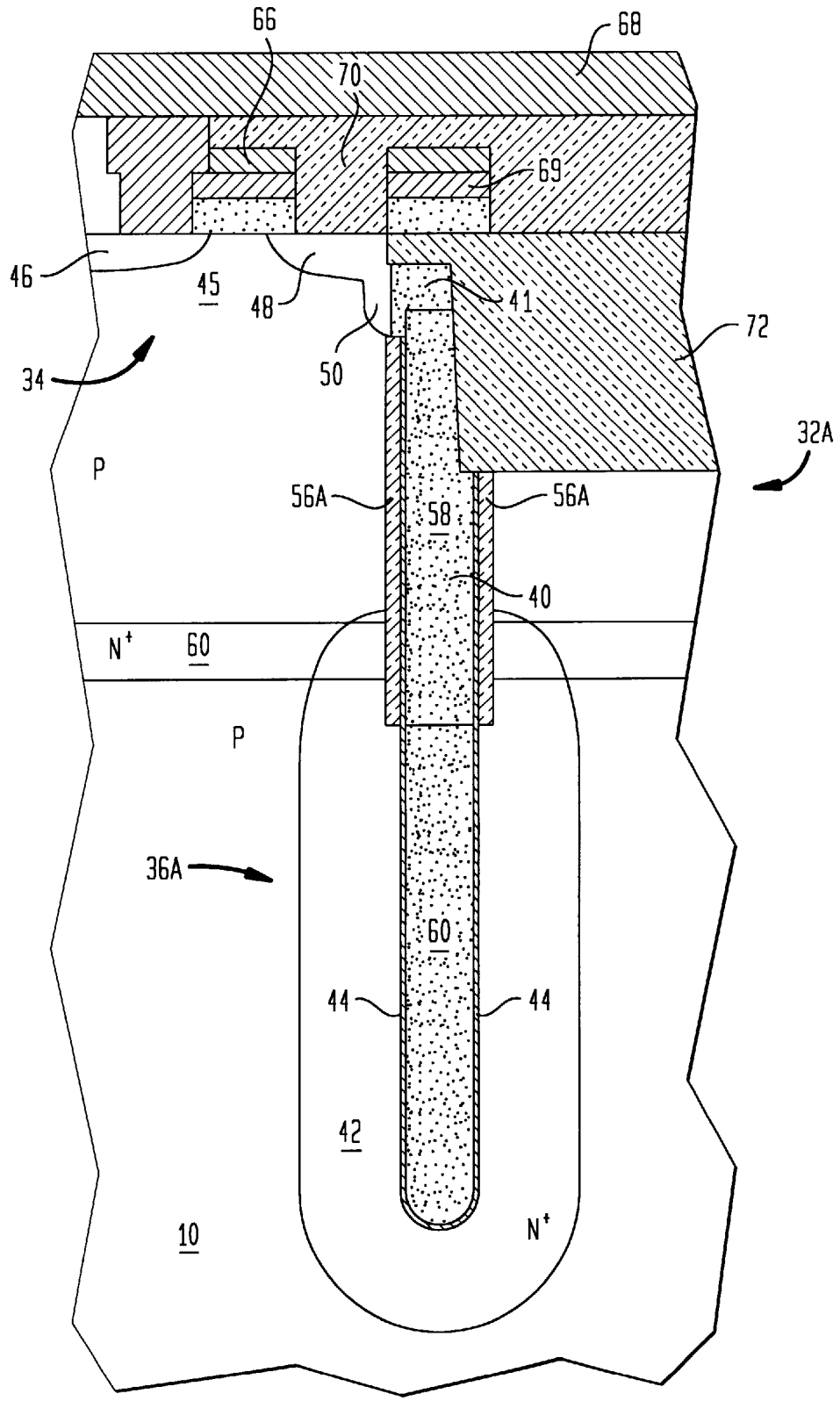
FIG. 6A is a diagrammatical, cross-sectional sketch of a DRAM cell having a trench capacitor formed in accordance with the PRIOR ART.
Figure 6B:
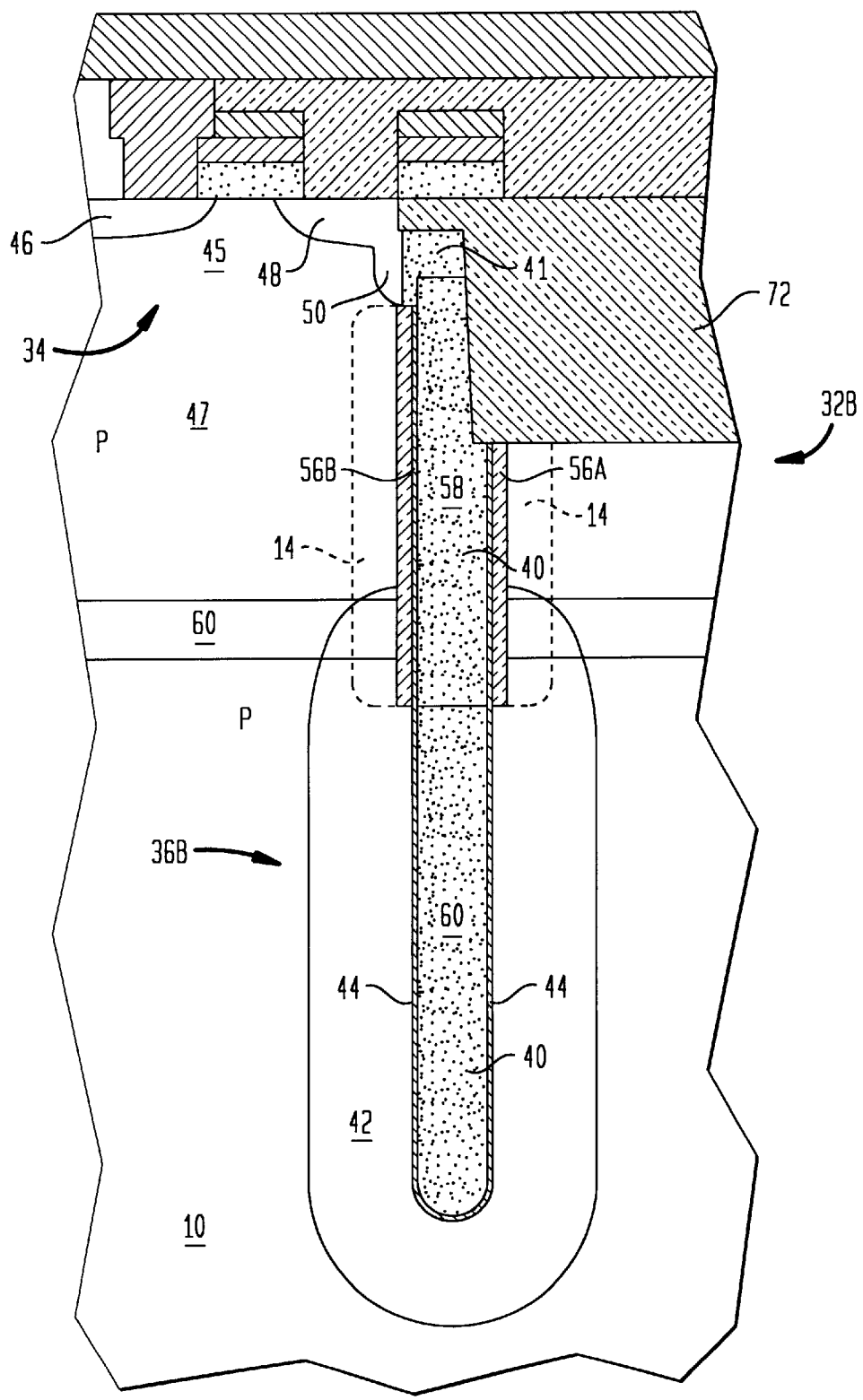
FIG. 6B is a diagrammatical, cross-sectional sketch of a DRAM cell having a trench capacitor formed in accordance with the invention.

Referring now to FIGS. 6A and 6B show a comparison between dynamic random access memory (DRAM) cells 32A, 32B with (FIG. 6B) and without (FIG. 6A) the above described hydrogen passivation layer 14. The DRAM cells 32A, 32B includes a MOSFET 34 and connected capacitors 36A, 36B, respectively, as shown. Here, the capacitors 36A, 36B are trench capacitors. An example of a DRAM cell 32A having a trench capacitor 36A is described in a paper entitled "A 0.6 $\mu m^2$ 256 Mb Trench DRAM Cell With Self-Aligned Buried Strap (BEST)" by Nesbit et al., published in IEDM 93-627.

The DRAM cells 32A, 32B comprises a trench capacitor 36A, 36B formed in a substrate 10, here silicon. As noted above, the substrate 10 is lightly doped with p-type dopants (p−), such as boron. The trench 60 is filled with, typically, polycrystalline silicon 40 heavily doped with n-dopant (n+), such as arsenic or phosphorous optionally, a buried plate 42 doped with, for example, arsenic, is provided in the substrate 10 surrounding the lower portion of the trench. The arsenic is diffused into the silicon substrate 10 from a dopant source, such as arsenic doped glass arsenic doped silica glass (ASG), that is formed on the sidewalls of the trench, and then stripped after the arsenic is diffused into the silicon walls of the trench to form the capacitor's plate 42 diffusion. The polycrystalline silicon 40 and buried plate 42 serves as the electrodes of the capacitor 36A, 36B. A node dielectric 44 separates the electrodes (i.e., plates 40, 42) of the capacitors 36A, 36B.

The DRAM cell also includes the transistor 34 (MOSFET). The transistor 34 includes a gate region 45 and source/drain regions 46, 48. The source/drain regions 46, 38, which are separated by the gate, or channel, region 45, are formed by implanting dopant such as boron in a well 47 having a conductivity type opposite to the conductivity type of the source and drain regions which use, for example, phosphorous or arsenic. A node region 50, referred to as a "node junction" 50 couples the capacitors 36A, 36B to the transistor 34. The "node junction" diffusion region 50 is formed by out-diffusing the dopants from the trench polycrystalline silicon 40 through a buried strap 41.

A dielectric collar 56A, 56B, is formed at the upper portion of the trenches of cells 32A, 32B, respectively, as indicated in FIGS. 6A and 6B, respectively. As used herein, the upper portion 58 of the trench refers to that section that includes the collar 32A, 32B and the lower portion 60 includes that section of the trench below the collar 32A, 34B. The collar 32A, 32B prevents leakage of the "node junction" 50 to the buried plate 42. Leakage is undesirable as it degrades the retention time of the DRAM cell 32A, 32B, increasing the refresh frequency which adversely impacts performance.

A buried well 60 comprising n-type dopants, such as phosphorous or arsenic, is provided below the surface of the substrate 10. The peak concentration of dopants in the buried n-well 60 is about the bottom of the collar 56A, 56B. Typically, the well 60 is lightly doped compared to the buried plate 42. The buried well 60 serves to connect the buried plates 42 of other DRAM cells in an array, not shown.

Activation of the transistor 34 by providing the appropriate voltages at the gate electrode 66 and bitline 68 accesses the trench capacitor 32A, 32B. Generally, the gate forms a wordline and source/drain region 46 is coupled to the bitline 68 in the DRAM array via a contact. The bitline 68 is isolated from the source/drain region 48 by an inter-level dielectric layer 70.

A Shallow Trench Isolation (STI) 72 is provided to isolate the DRAM cell 34A, 34B from other cells or devices, not shown, formed in the substrate 10. As shown, a wordline 69 is formed over the trench and isolated therefrom by the STI 72. Wordline 69 is referred to as a "passing wordline" and is connected to a neighboring DRAM cell, not shown. Such a configuration is referred to as a folded bitline architecture.

Figure 7A:
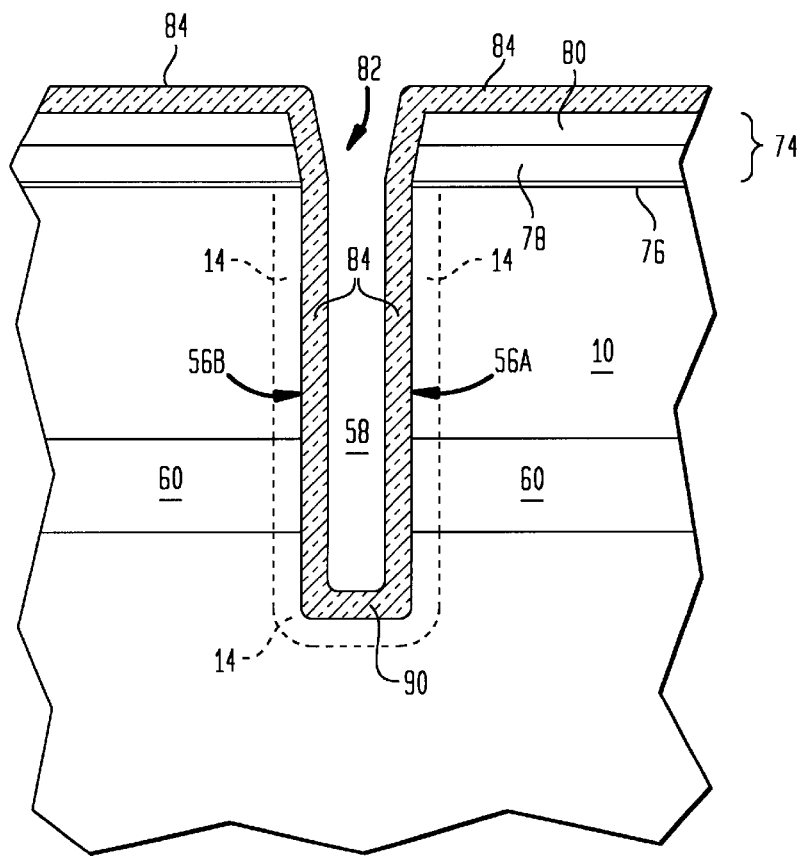
FIGS. 7A–7D are diagrammatical, cross-sectional sketches of the DRAM cell of FIG. 6B at various steps in the manufacture thereof.

The trench capacitor 32B (FIG. 6B) is here formed in a two-step etching process. Referring to FIG. 7A, a pad stack 74 is formed on the surface of the silicon substrate 10. The substrate 10 is lightly doped with p-type dopant (p−), such as boron. The substrate 10 includes the buried n-type conductivity well 60, described above, that is used to connect the buried plates of the trench capacitor. The pad stack 74 comprises various layers, including a hard mask layer 76 (such as boron doped silicate glass (BSG), tetraethylorthosilicate, TEOS), a pad stop layer 78 of silicon nitride and a pad silicon dioxide layer 80. The hard mask is patterned using conventional photolithography to define a region in which a trench 82 is to be formed. A first reactive ion etch (RIE) is performed to form the trench 82 in the silicon substrate 10 having a predetermined depth equal to the depth of the collar 56B, described above in connection with FIG. 6B, formed around the upper region 58 of the trench capacitor 36B.

A dielectric layer 84 is used to form the collar 56B (FIG. 6B). Here, the dielectric layer 84 includes silicon dioxide and the hydrogen passivation layer 14 formed by one of the methods described above in connection with FIGS. 1A–1E and 5A–5C. The dielectric layer 84 cover the pad stack 74 and sidewalls of the trench 82. It is noted that at the same given thickness, the collar 56B formed with the hydrogen passivation layer 14 shows reduced leakage in a parasitic vertical FET because of its lower capacitance as compared with the collar 56A (FIG. 6A) formed without the hydrogen passivation layer 14. Thus, a thinner collar 56B oxide dielectric 84 (FIG. 7A) is possible with the hydrogen passivation layer 14 in order to stay below a given leakage specification. Further, because of the ability to use a thinner silicon dioxide layer 84 for the collar 56B, reduction in mechanical stress in the silicon body 10 results thereby reducing the susceptibility to dislocation formation. For the case of a composite collar having a CVD silicon dioxide deposited on thermally grown silicon dioxide layer 84 or a thick LOCOS (e.g., 35 nm thick) thermally grown collar, the possibility of reducing the collar thickness allows the use of thicker polycrystalline silicon films to be formed in the collar region (i.e., the upper region 58, FIG. 6B) of the trench which improves sheet resistance. This is especially important for trenches with design rules below 0.18 μm. Additionally, the presence of hydrogen passivation layer 14 in the collar region 58 will not only passivate boron but also passivates a number of local defects in the silicon body 10.

Figure 7B:
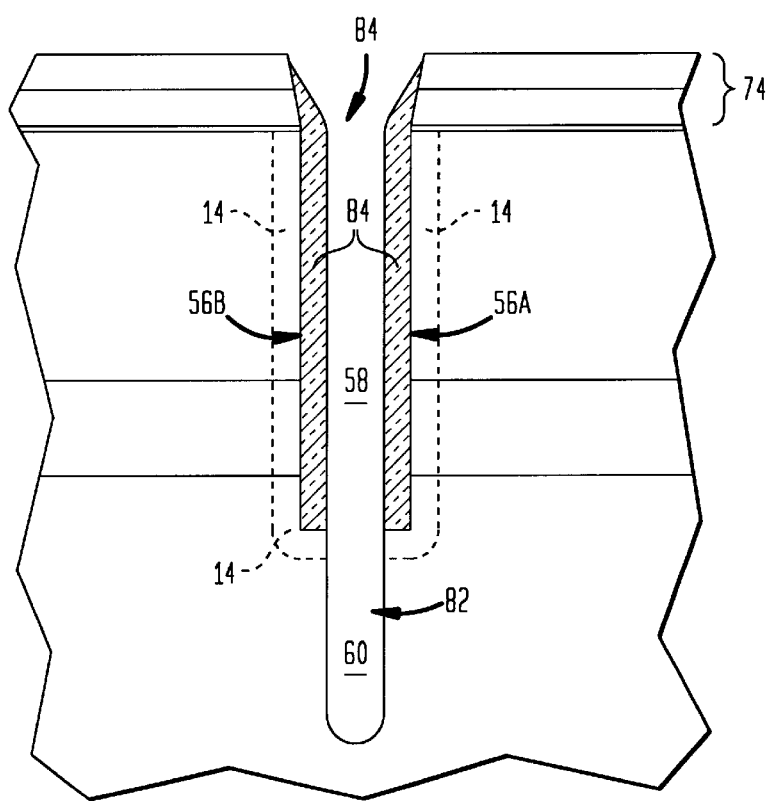

Referring to FIG. 7B, the silicon dioxide 84 is removed from all planar surfaces (i.e., at the top of the gate stack and at the bottom portion 90 of the trench 82). A RIE such as, for example, an oxide plasma etch, is employed to remove the excess silicon dioxide 84 from the bottom 90 of the trench 82. A second RIE is performed in order to form the lower portion 60 of the trench 82. The second RIE is, for example, a silicon plasma etch. The collar 56B acts as an etch mask during this second RIE.

After the formation of the lower portion 60 of the trench 82, an n-type buried plate 42 is optionally formed. The buried plate 42 is formed by, for example, gas phase doping, plasma doping, or ion implantation. Alternatively, doped silicate glass may be deposited to line the trench 82 sidewalls to provide a dopant source from which dopants defuse into the substrate by a drive anneal. Removal of the doped silicate glass is achieved by, for example, chemical etching with buffered hydrofluoric acid.

Figure 7C:
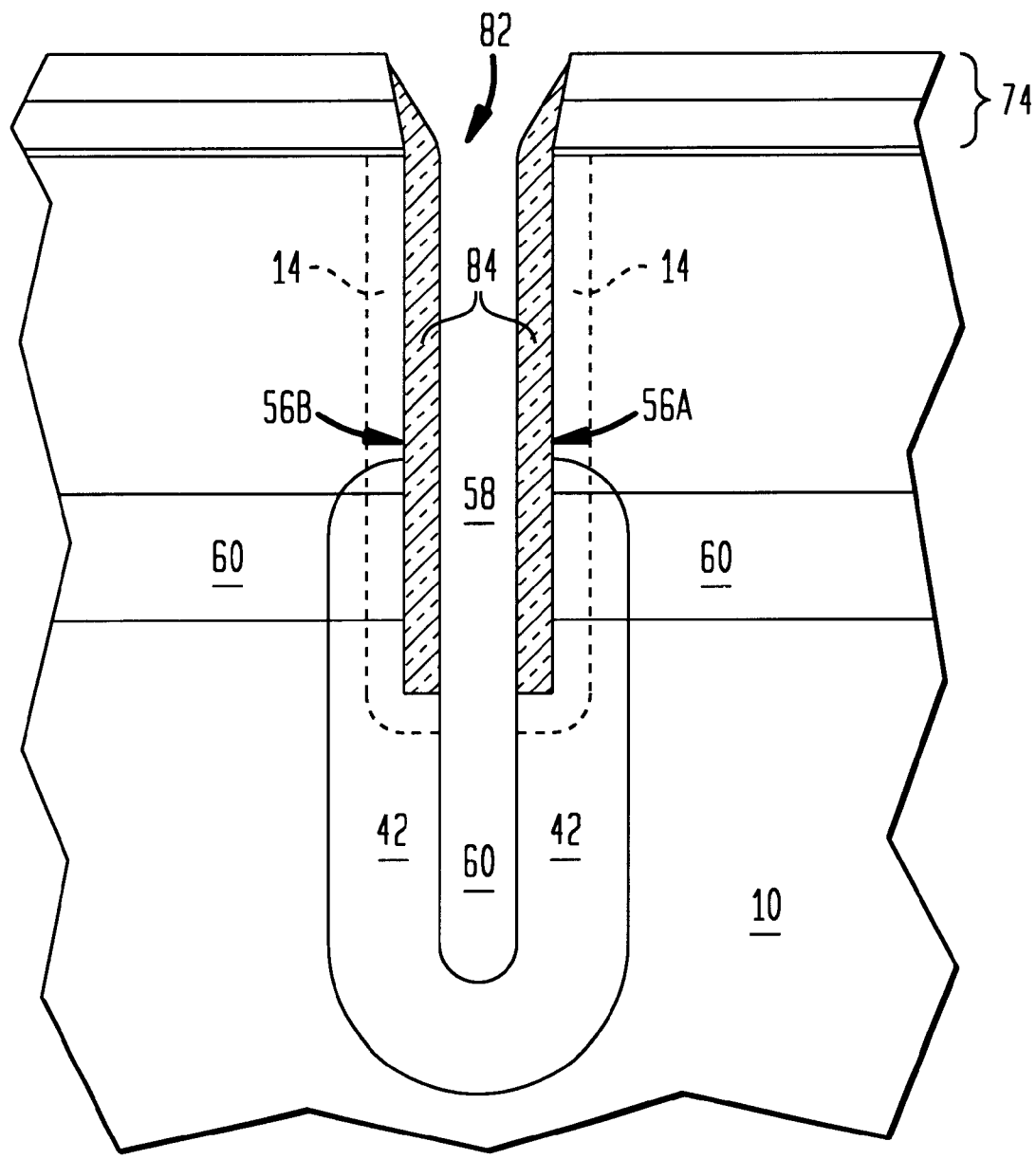
Figure 7D:
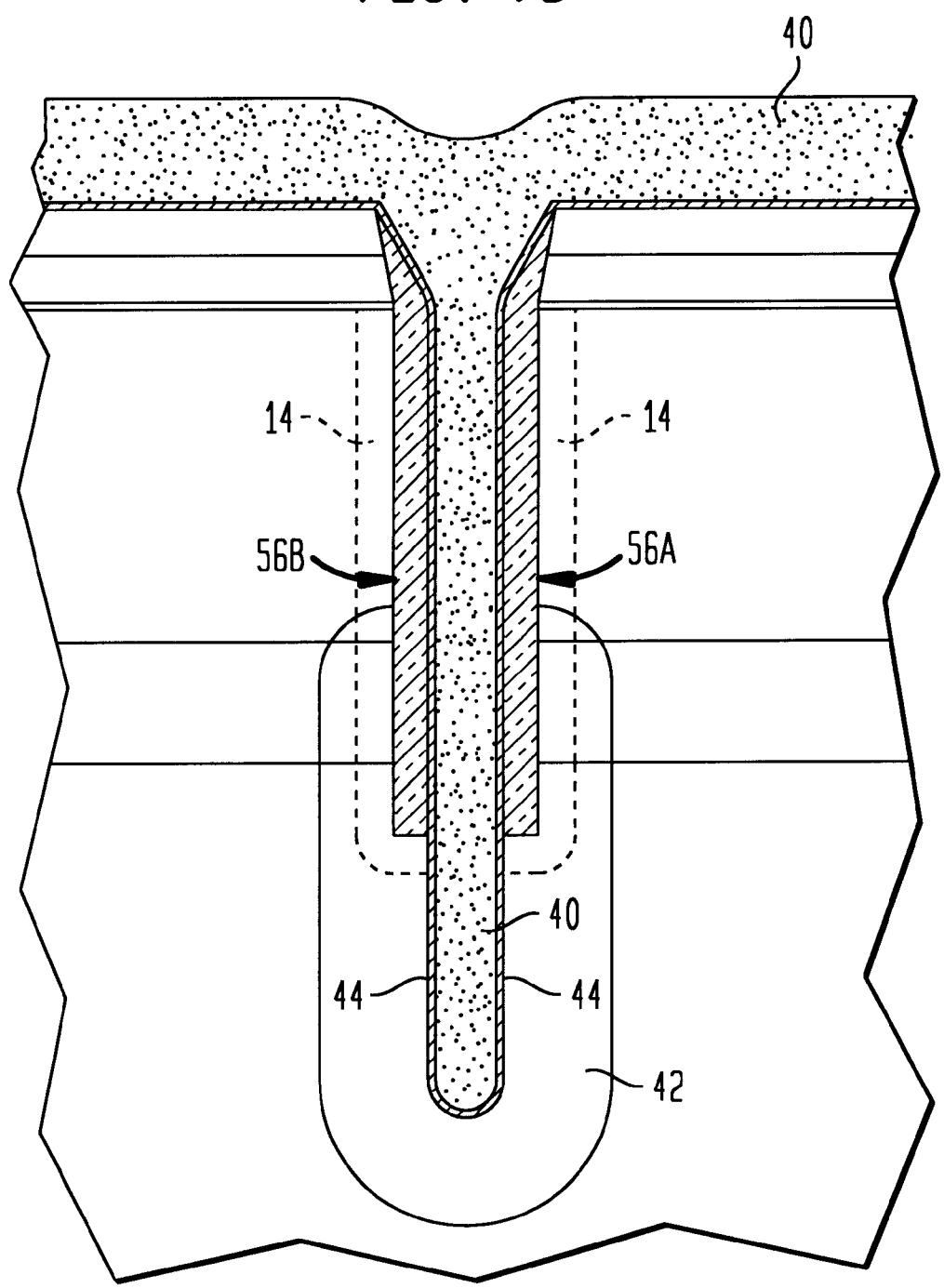

Referring to FIG. 7D, the node dielectric layer 44 is deposited on the wafer, lining the trench 82 (FIG. 7C) sidewalls. The trench 82 is then filled with polycrystalline silicon (poly) 40. The trench fill process also covers the surface of the wafer with the poly 40. The poly 40 is heavily doped with n-type dopants.

The process continues to form the remaining portions of the DRAM cell as shown in FIG. 6B. This includes recessing the upper portions of the poly 40, the upper portions of the collar 56B, and the upper portions of the node dielectric 44 in the trench and forming the strap 41, defining the isolation region to form the STI 72, depositing and patterning the various layers comprising the stack, depositing an inter-level dielectric layer, creating contact opening and forming the bitline. Such processes are described in the above referenced article and in an article by El-Kareh et al., Solid State Technology, p-89 (May 1997).

Figure 8:
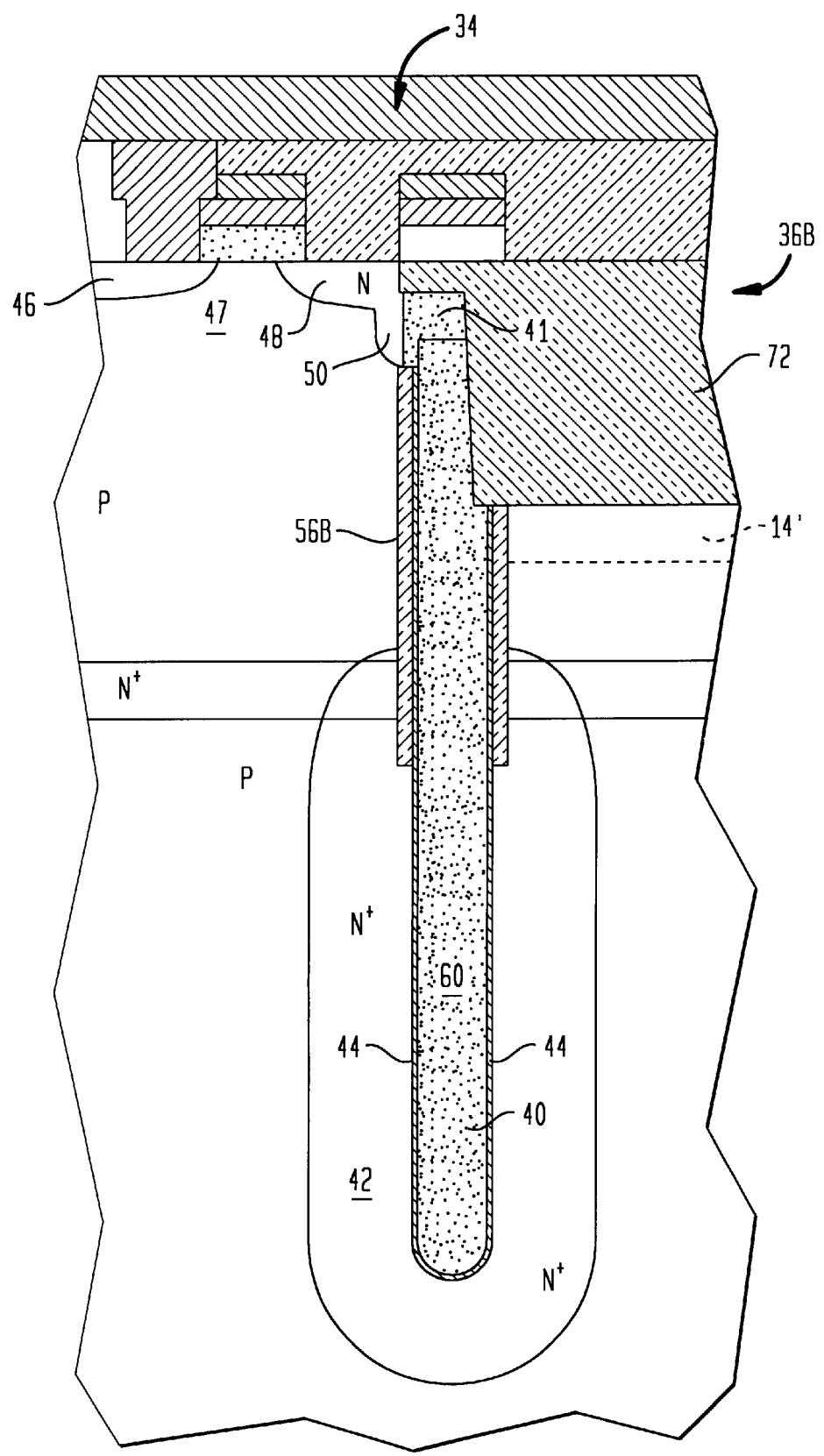
FIG. 8 is a diagrammatical, cross-sectional sketch of a DRAM cell having a trench capacitor formed in accordance with another embodiment of the invention.
Figure 9:
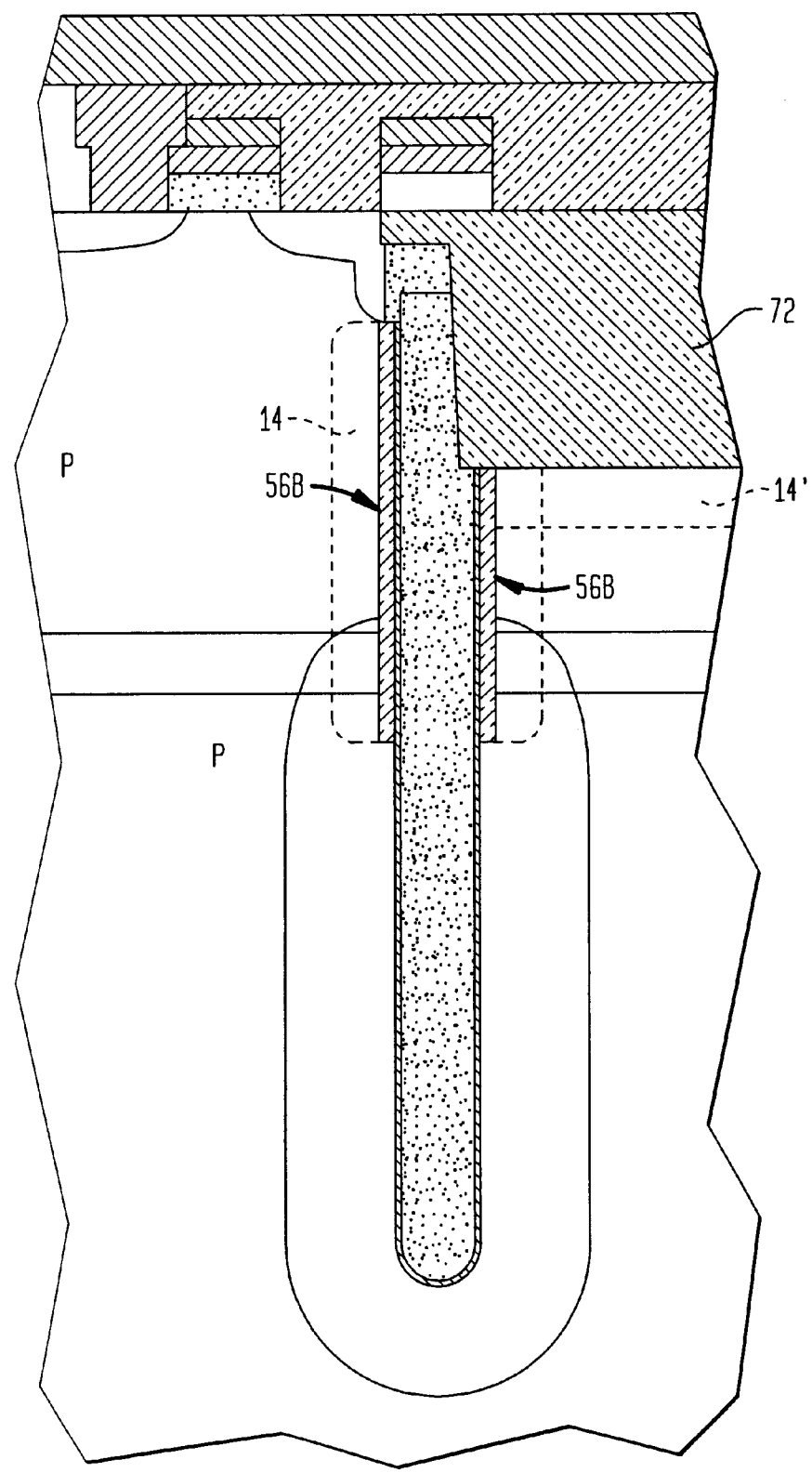
FIG. 9 is a diagrammatical, cross-sectional sketch of a DRAM cell having a trench capacitor formed in accordance with still another embodiment of the invention.

It is noted that here the Shallow Trench Isolation (STI) 72 may be formed with a hydrogen treated silicon dioxide to form a hydrogen passivation layer 14' (FIG. 8) using one of the processes described above in connection with FIGS. 1A–1E and 5A–5C. The hydrogen will remove or passivate defects such as etch damage and pre-existing defects below the STI 72 (passivation layer region), which significantly reduces under STI leakage. Since this leakage mechanism is also an important contributor to the overall cell leakage, the hydrogen passivation improves retention time by reducing this leakage current. FIG. 9 shows a DRAM cell with both a hydrogen passivation layer 14 around collar 56 and a hydrogen passivation layer 14' under STI 71.

Thus, in summary, the DRAM cell 32B (FIG. 6B) is formed in a silicon substrate 10 having. a transistor coupled to a capacitor. The transistor has source and drain regions 46, 48 having a first type conductivity (here N type conductivity) in an upper portion of the substrate 10, such source and drain regions 46, 48 being disposed in a P type conductivity well 47 in the substrate 10. The capacitor includes the trench 60 disposed in the substrate. A first dielectric layer 44, here silicon nitride, is disposed on intermediate and lower walls of the trench 60. A first conductive material 40, here the N doped polycrystalline silicon, is disposed in the trench 60 on the first dielectric layer 44 and an upper portion of such first conductive material 40. The first conductive material 40 is electrically connected to one of the source and drain regions, here region 48, through the node region 50 disposed in the substrate between such one of the source and drain regions, here region 48, and the upper portion of the first conductive material 40 in the trench 60. The first conductive material 40 provides a first electrode for the capacitor. A second conductive material 44 is disposed in the substrate about the lower portion of the trench 60. The second conductive material, here diffused N$^+$ type conductivity material 40 is dielectrically separated from the first conductive material 60 by the lower portion of the first dielectric material 44. The second conductive material provides a second electrode for the capacitor.

A second dielectric material 55 (i.e., the aforementioned collar) is disposed the substrate 10 about the intermediate portion of the first dielectric region 44 to dielectrically isolate the node region 50 of the trench from the second conductive material 44. That is, the dielectric collar (i.e., silicon dioxide layer 56) prevents transistor action between the one of the source and drain regions, here region 48 electrically connected to the junction region 50 and the N$^+$ region 42 providing the second electrode of the capacitor. To put it another way, an unwanted MOS field effect transistor may be formed with the junction region 50 and the N$^+$ region 42 providing source and drain regions and the first conductivity region 60 providing a gate with the first dielectric layer 44 providing the gate insulation. It is remembered that the first dielectric material 44 is silicon nitride having a relatively high dielectric constant in order to provide a large trench capacitance 32B for the DRAM cell. In order to reduce the capacitance between the intermediate P type well portion which provides the channel region for the unwanted MOS field effect transistor (i.e., the region disposed between the junction region and the N$^+$ region forming the second electrode for the capacitor), the silicon dioxide layer 56 (i.e., the dielectric collar) is used. However, while increasing the thickness of the silicon dioxide layer 56 will increase the effective thickness of the dielectric in this collar region (and thereby reduce the capacitance of the unwanted transistor action), increasing such silicon dioxide layer 56 thickness increases mechanical stress in the walls on the portions of the trench upon which the silicon dioxide layer 56 is disposed. Here, however, the hydrogen passivation layer 14 is disposed in the intermediate portion of the trench (i.e., about portions of the second dielectric material) to enable thinner silicon dioxide layer 56 collar while the effective capacitance between the first conductive material 40 and the P well region 47 is reduced (i.e., the unwanted transistor action is reduced).

Figure 10A:
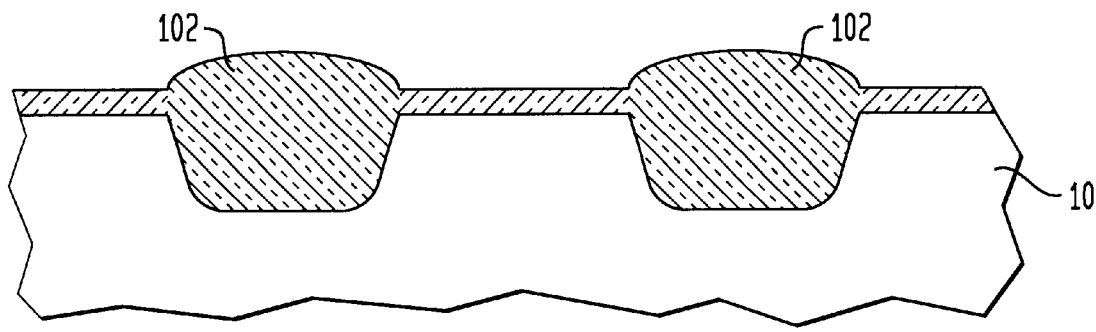
FIG. 10A is a diagrammatical, cross-sectional sketch of silicon body having LOCOS field oxides according to the PRIOR ART.
Figure 10B:
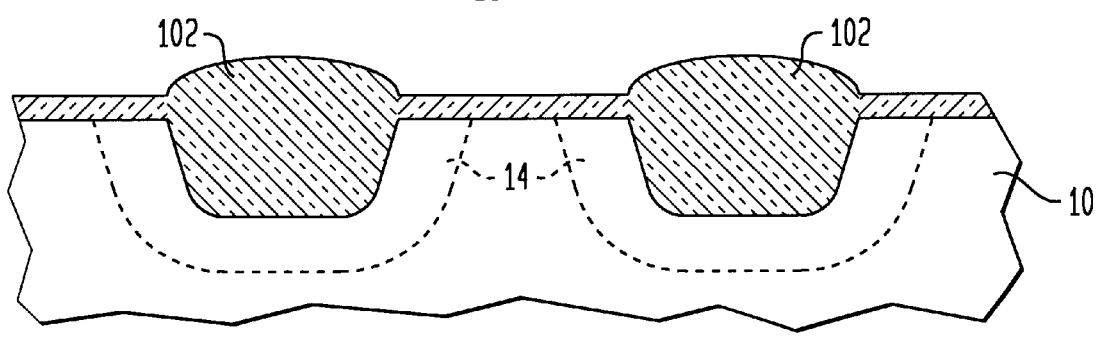
FIG. 10B is a diagrammatical, cross-sectional sketch of silicon body having LOCOS field oxide showing a hydrogen passivation layer according to the invention.

Referring to FIGS. 10A and 10B, here a hydrogen rich passivation layer 14 (i.e., a layer having at least $10^{17}$ hydrogen atoms per cubic centimeter, or greater) is formed using one of the processes described above in connection with FIGS. 1A–E and 5A–5C, below a LOCOS isolation 102 (i.e., field oxide isolation region) used to isolate adjacent active devices. Thus, the hydrogen is introduced into the interface region between the silicon dioxide LOCOS field oxide 102 and the silicon substrate 10.

Figure 11A:
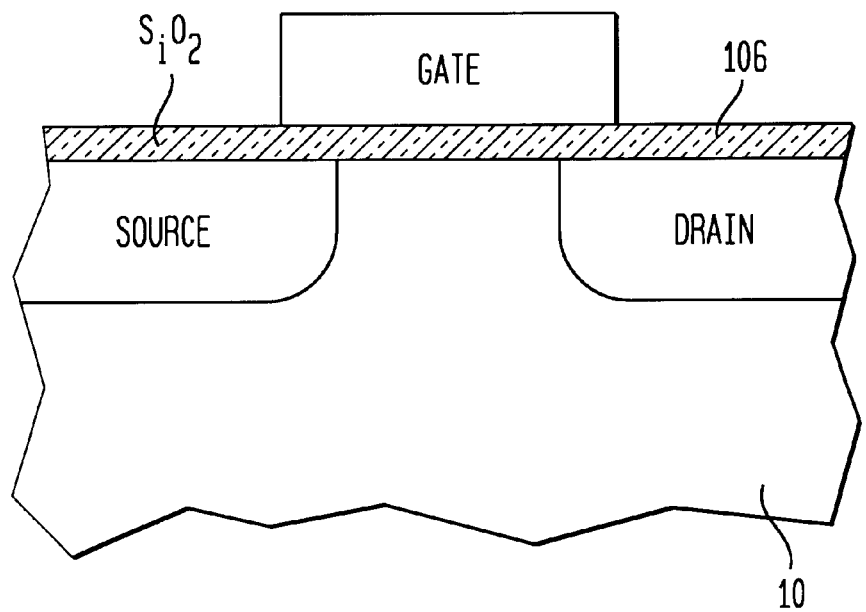
FIG. 11A is a diagrammatical, cross-sectional sketches of silicon body having MOSFET formed therein according to the PRIOR ART.
Figure 11B:
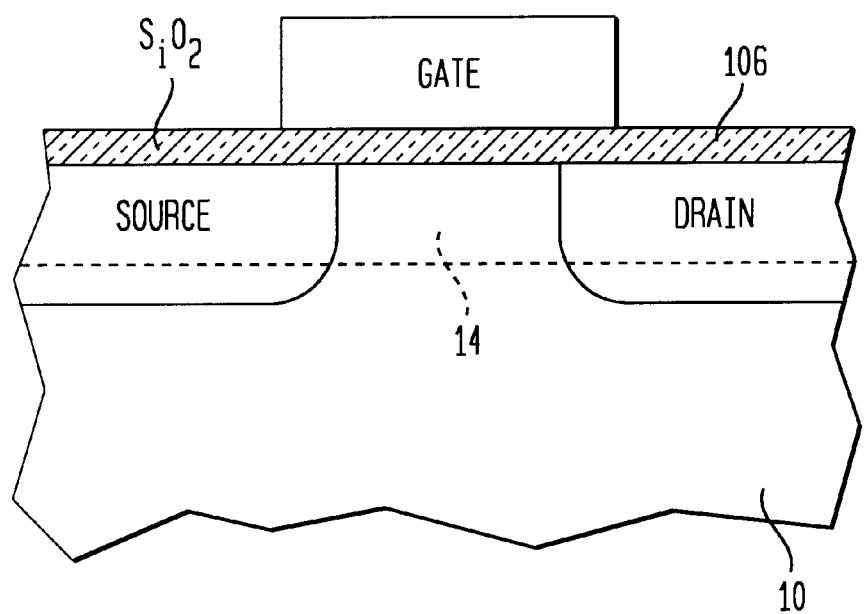
FIG. 11B is a diagrammatical, cross-sectional sketches of silicon body having MOSFET formed therein showing a hydrogen passivation layer according to the invention.

Referring to FIGS. 11A and 11B, a gate oxide 106 is shown formed with hydrogen passivation layer 14 according to one of the processes described above in connection with FIGS. 1A–1B and 5A–5C.

Figure 12A:
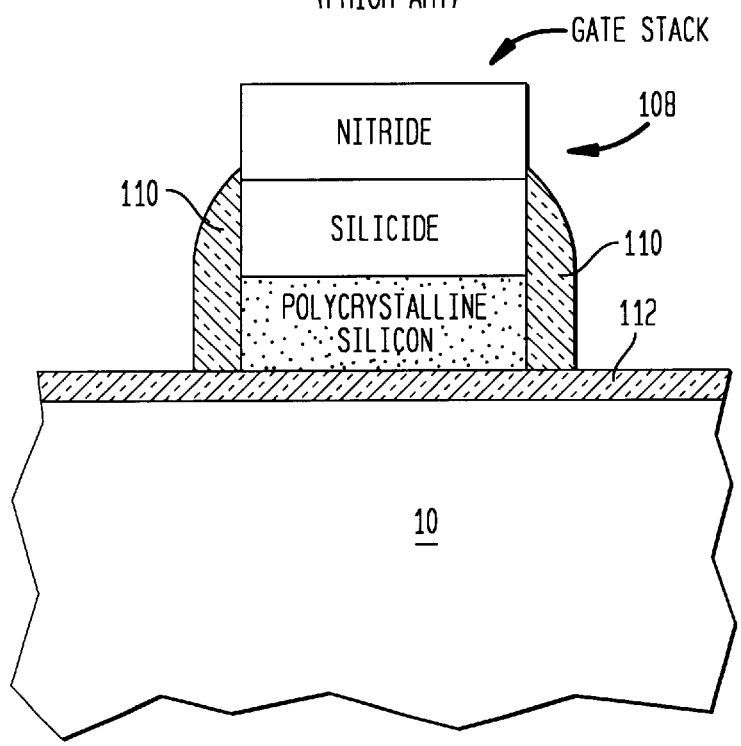
FIGS. 12A and 12B are diagrammatical, cross-sectional sketches of silicon body having gate stacks formed therein at various steps in the manufacture formed, FIG. 12A showing such stack according to the PRIOR ART and FIG. 12B showing the stack according to the invention.
Figure 12B:
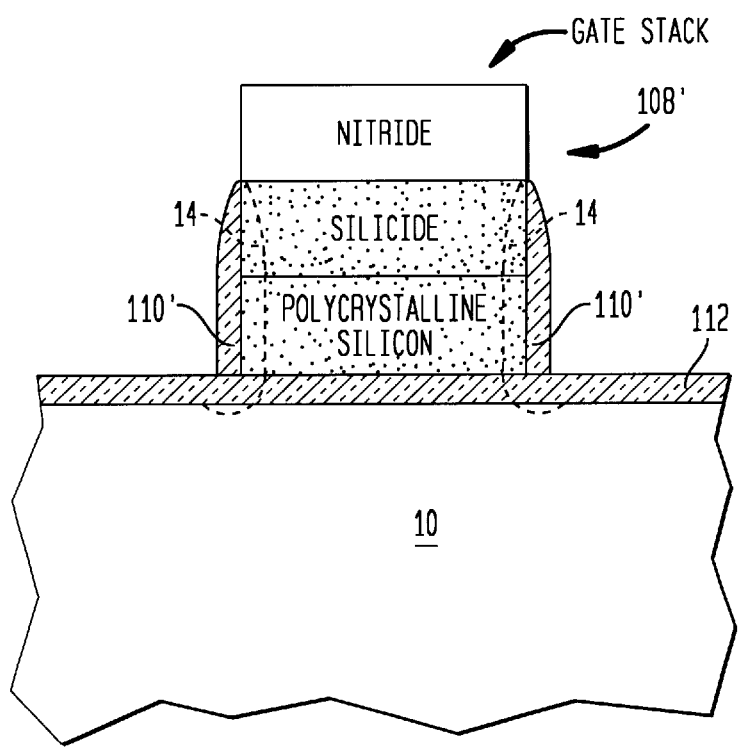
Figure 13A:
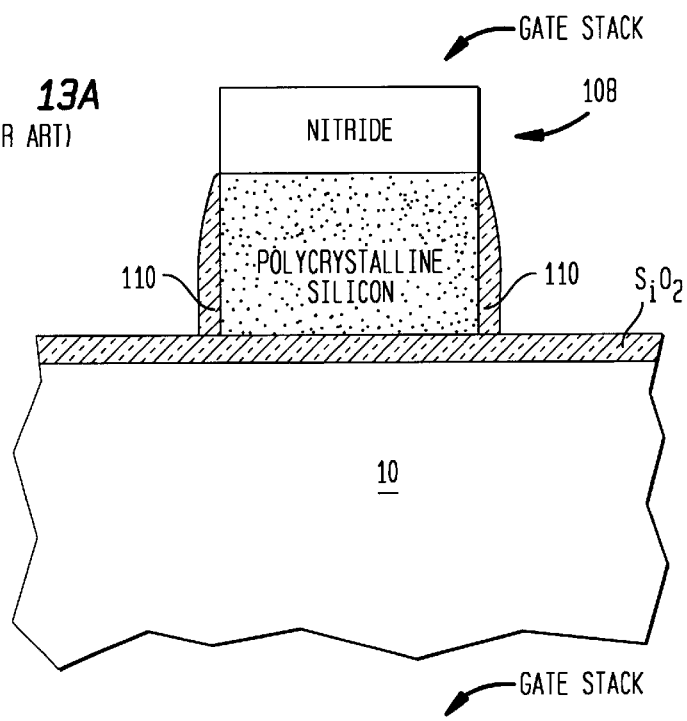
FIGS. 13A and 13B are diagrammatical, cross-sectional sketches of silicon body having gate stacks formed therein at various steps in the manufacture formed, FIG. 13A showing such stack according to the PRIOR ART and FIG. 13B showing the stack according to the invention.
Figure 13B:
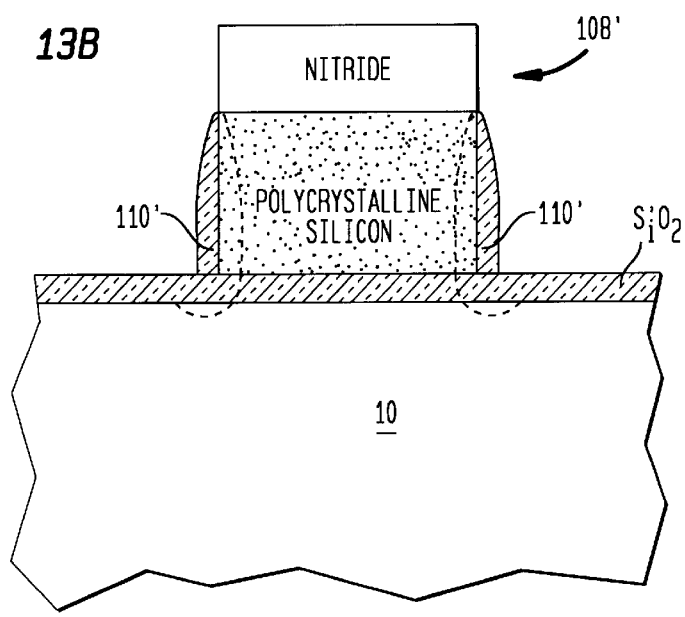

Referring to FIGS. 12A, 12B and 13A, 13B, a gate conductor stack 108' (FIGS. 12B and 13B) is shown having a hydrogen passivation layer 14 according to one of the processes described above in connection with FIGS. 1–5C. The use of the hydrogen passivation layer 14 permits the use of thinner sidewall oxides 110' at the same leakage current level as compare to a device having oxide walls 110 without such hydrogen passivation layer 14 (FIGS. 12A and 13B). This allows reduced thermal budget sidewall oxide 110' (FIGS. 12B and 13B) formation as well as higher integration density compared to devices without the gate conductor sidewall isolation with the hydrogen passivation layer 14 (FIGS. 12A and 13A). Using a hydrogen implant, the hydrogen profile can be customized such that e.g. the gate induced drain leakage is suppressed by forming a localized passivation region around the intersection between the sidewall dielectric 110, 110' and the gate dielectric 112.

Figure 14A:
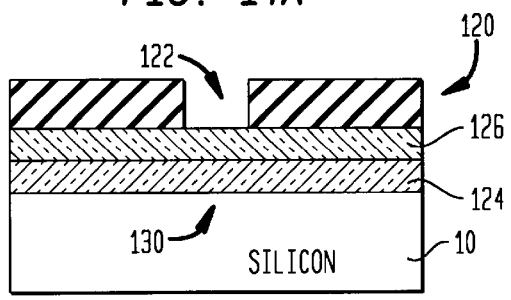
FIGS. 14A and 14B are diagrammatical, cross-sectional sketches of silicon body having a hydrogen passivation region formed in a selected surface portion of a silicon substrate at various steps in the formation of such passivation region.
Figure 14B:
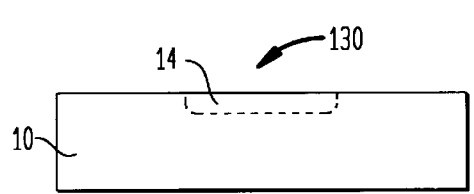

It is noted that hydrogen passivation layer 14 may be formed in selected regions of the substrate. For example, referring to FIG. 14A, a mask 120, with a window 122 therein, is formed over a selected region of a silicon substrate 10 having a silicon dioxide layer 124 and a silicon nitride layer 126 thereon. Next the portions of the silicon nitride layer 124 and silicon dioxide layer 126 are removed using conventional lithography and etch techniques to expose an underlying portion 130 of the silicon substrate 10 surface. The hydrogen passivation layer 14 is then formed in the selected surface portion 130 of the silicon substrate 10, as shown in FIG. 14B. Thus, for example, LOCOS regions may be formed in selected regions of the silicon substrate as described above in connection with FIG. 10B.

Other embodiments are within the spirit and scope of the appended claims.

What is claimed is:

1. A method for reducing parasitic capacitance between a first doped region of a transistor and a second doped region, formed in a semiconductor substrate, such second doped region providing a first electrode of a capacitor formed in said substrate, such capacitor having a second electrode formed in a trench in the substrate, such capacitor having, as a dielectric material thereof, a silicon dioxide layer on upper and lower portions of a sidewall of the trench, such first doped region being disposed adjacent the upper portion of the sidewall and such second doped region being disposed adjacent the lower portion of the sidewall, such method comprising the steps of:

forming a dielectric collar extending vertically along a portion of the substrate between the first doped region and the second doped region to electrically isolate the first doped region from the second doped region; and introducing hydrogen atoms into a portion of said substrate disposed under the collar between the first and second doped regions to decrease the dielectric constant of such surface portion increasing the effective thickness of the dielectric material on the upper portion of the sidewall and hence reducing said parasitic capacitance, wherein the step of introducing hydrogen atoms follows the step of forming the dielectric collar.

2. The method recited in claim 1 including the step of forming the silicon dioxide layer with a thickness greater than two nanometers.

3. The method recited in claim 2 wherein the step of introducing hydrogen comprises baking in hydrogen at a temperature of 950° C. to 1100° C. and pressure greater than 100 Torr.

4. The method recited in claim 2 wherein the step of introducing hydrogen comprises the step of forming hydrogen atoms in the surface to a concentration of $10^{17}$ atoms per cubic centimeter, or greater.

5. The method recited in claim 1 including forming a shallow trench isolation region in the silicon substrate comprising forming an isolation trench in the surface of the substrate for the shallow trench isolation region with hydrogen atoms being introduced into the bottom surface of the isolation trench.

6. A method for forming a shallow trench isolation region in a silicon substrate, comprising:

forming a trench having a bottom surface in the surface of the substrate for the shallow trench isolation region;

forming a silicon dioxide layer disposed on a bottom surface of the trench;

introducing hydrogen atoms into the bottom surface of the trench to decrease the dielectric constant of the silicon dioxide layer disposed on the bottom surface, wherein the step of introducing hydrogen atoms follows the step of forming the silicon dioxide layer.

7. A method for forming a gate conductor stack comprising:

forming a dielectric on sidewalls of such stack; and forming a hydrogen passivation layer in the sidewalls of the gate conductor stack to decrease the dielectric constant of the dielectric, wherein the step of forming a hydrogen passivation layer follows the step of forming the dielectric.

8. The method recited in claim 7 wherein forming the hydrogen passivation layer comprises implanting hydrogen into the sidewalls of the gate conductor stack.

9. The method recited in claim 8 wherein the implant includes forming such hydrogen passivation layer around an intersection between the dielectric on the sidewalls of the gate conductor stack and a gate dielectric layer on a surface of a semiconductor substrate, such gate dielectric layer having portions under the gate conductor stack.

10. A method for forming a shallow trench isolation region in a silicon substrate, comprising:

forming an isolation region in the shallow trench; and forming a hydrogen passivation layer in the semiconductor body beneath the isolation region to decrease the dielectric constant of the isolation region, wherein the step of forming a hydrogen passivation layer follows the step of forming the isolation region.

11. The method recited in claim 10 wherein the isolation region is formed as a LOCOS isolation region.

12. The method recited in claim 11 wherein the hydrogen passivation layer forming comprises introducing hydrogen into an interface region between the LOCOS region and the semiconductor substrate.

13. The method recited in claim 10 wherein the hydrogen passivation layer has at least $10^{17}$ hydrogen atoms per cubic centimeter or greater.

14. The method of claim 1 wherein the step of forming a dielectric collar comprises thermally growing silicon dioxide using rapid thermal oxidation.

15. The method of claim 10 wherein the step of forming a hydrogen passivation layer comprises implanting the semiconductor body beneath the isolation region with hydrogen ions using plasma doping (PLAD).

16. The method of claim 10 wherein the step of forming a hydrogen passivation layer comprises implanting the semiconductor body beneath the isolation region with hydrogen ions using plasma immersion ion implantation (PIII).

* * * * *